(12) United States Patent
Ezzeddine et al.

(10) Patent No.: US 7,459,989 B2
(45) Date of Patent: Dec. 2, 2008

(54) INTEGRATED PHASE SHIFTER OF DIFFERENTIAL SIGNALS IN QUADRATURE

(75) Inventors: Hilal Ezzeddine, Tours (FR); Francois Dupont, Tours (FR); Benjamin Therond, Tours (FR)

(73) Assignee: STMicroelectronics S.A., Montrouge (FR)

( * ) Notice: Subject to any disclaimer, the term of this patent is extended or adjusted under 35 U.S.C. 154(b) by 10 days.

(21) Appl. No.: 11/807,499

(22) Filed: May 29, 2007

(65) Prior Publication Data
US 2007/0296524 A1 Dec. 27, 2007

(30) Foreign Application Priority Data
May 31, 2006 (FR) .................... 06 51991

(51) Int. Cl.
*H03H 7/46* (2006.01)
(52) U.S. Cl. ........................ 333/132; 333/166
(58) Field of Classification Search ................. 333/132, 333/134, 138, 166
See application file for complete search history.

(56) References Cited

U.S. PATENT DOCUMENTS 3,879,689 A * 4/1975 Seidel ........................ 333/138

2006/0087384 A1 4/2006 Ezzendine
2008/0024242 A1 * 1/2008 Nam et al. .................. 333/132

OTHER PUBLICATIONS

French Search Report form French Patent Application 06/51991, filed May 31, 2006.
Robert C. Frye; Sharad Kapur: Robert C. Melville: "A 2-GHz Quadrature Hybrid Implemented in CMOS Technology" IEEE Journal of Solid-State Circuits, May 12, 2002, May 15, 2002, pp. 287-290, XP002403964 IEEE, NY, USA.

* cited by examiner

*Primary Examiner*—Don P Le
(74) *Attorney, Agent, or Firm*—Lisa K. Jorgenson; James H. Morris; Wolf, Greenfield & Sacks, P.C.

(57) ABSTRACT

A distributed phase shifter including: a first planar winding having its ends defining accesses in phase opposition; a second planar winding coupled with the first one and grounded by a first capacitive element; a third planar winding in a conductive level different from that receiving the first winding and electrically in series with the second winding; and a fourth planar winding, coupled with the third one in a conductive level different from that receiving the second winding, first ends of the third and fourth windings being connected by a capacitive element and their second ends being connected by another capacitive element, their first and second respective ends defining accesses in phase quadrature.

9 Claims, 3 Drawing Sheets

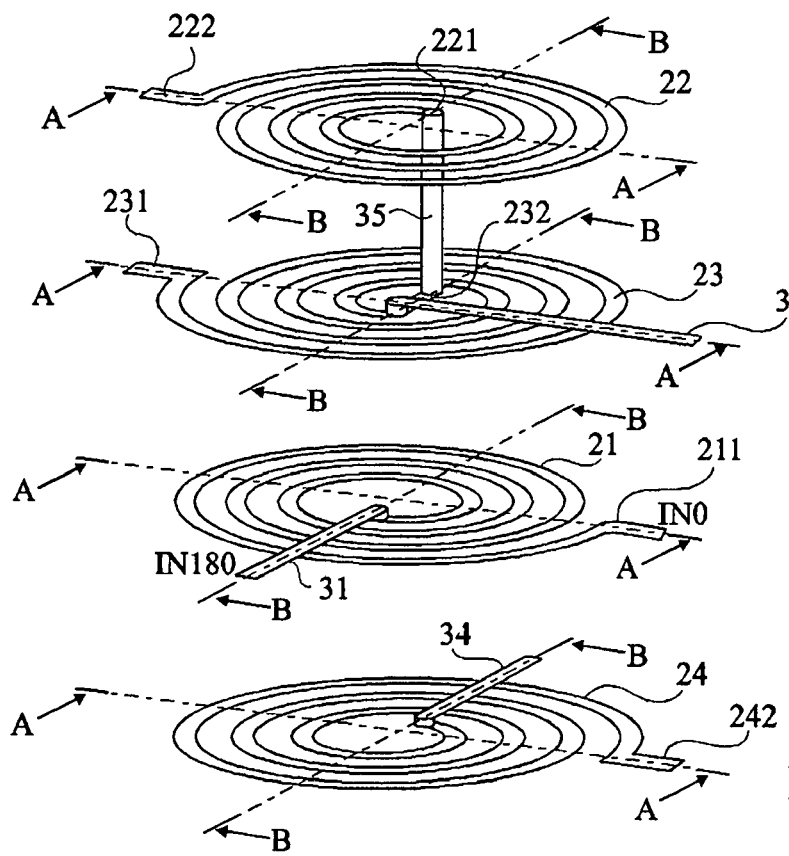
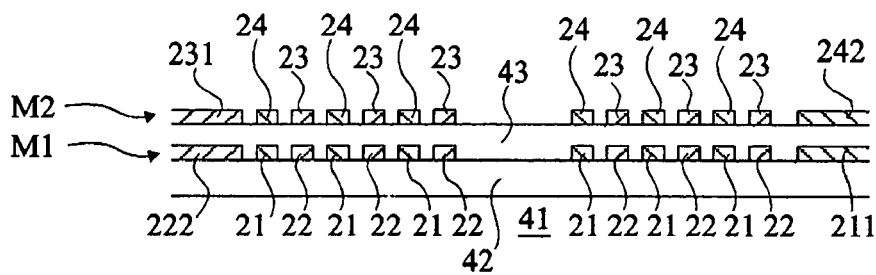
Fig 7A
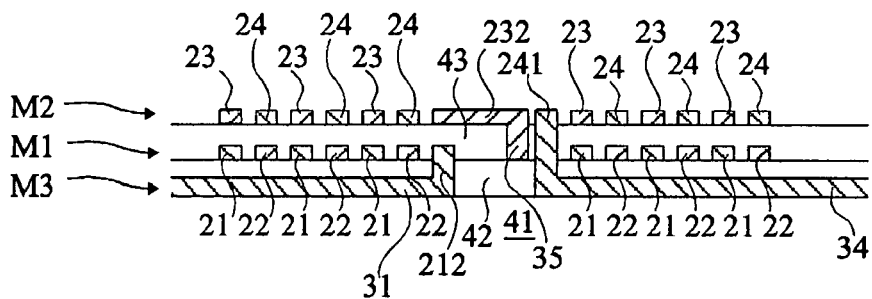
Fig 7B

INTEGRATED PHASE SHIFTER OF DIFFERENTIAL SIGNALS IN QUADRATURE

BACKGROUND OF THE INVENTION

1. Field of the Invention

The present invention generally relates to phase shifters in a distributed or coupled line technique. Such devices are used to phase shift radiofrequency signals with respect to each other, generally by 90°. Such devices can be found in association with balanced power amplifiers, mixers, power combiners/dividers, most often to shift the phase of radiofrequency signals corresponding to different paths.

2. Discussion of the Related Art

FIG. 1 is a block diagram of a circuit performing a 90° phase shift of two input signals. Such a circuit comprises two accesses IN0 and IN180, arbitrarily designated as inputs, intended to receive two differential signals Pin 0° and Pin 180° (in phase opposition), and two accesses OUT0 and OUT90, arbitrarily designated as outputs, intended to provide signals Pout 0° and Pout 90° in phase quadrature. Such a device most often is bi-directional, that is, it may be used, according to its assembly in an electronic circuit, to shift the phase of differential input signals to obtain signals in phase quadrature or to increase the phase shift of a signal in quadrature to obtain a signal in phase opposition.

FIG. 2 is a schematic block diagram of a conventional example of a radiofrequency transmit circuit using a phase shifter (block 1). This phase shifter belongs to a radiofrequency transmission head 10 and is interposed between differential inputs RFin+ and RFin− receiving a signal to be transmitted and two amplifiers 11 and 12 (PA) intended to receive radiofrequency signals in phase quadrature. Signals RFin+ and RFin− are in phase opposition, especially for better noise immunity. Circuit 10 is powered by a generally D.C. voltage Valim. The respective outputs of amplifiers 11 and 12 provide amplified signals ARF0 and ARF90 to a combiner 15, possibly after crossing of impedance matching circuits 13 and 14 (MATCH) (shown in dotted lines). The function of combiner 15 is to add two input powers in a common path to form an RF signal sent onto an antenna 16 for the transmission. A coupler may be added to combiner 15 to extract data proportional to transmitted power Pout to adjust the gains of amplifiers 11 and 12.

A similar architecture may be used for a reception chain. In this case, the combined RF access is used as an input terminal while two distributed accesses provided by the combiner in phase quadrature are sent onto two reception inputs of a radiofrequency reception head comprising a phase shifter for providing signals in phase opposition for the processing circuits.

The forming of a phase shifter may use so-called lumped-element techniques (association in an electric diagram of lumped inductive and capacitive elements) or with distributed or coupled lines (conductive lines arranged sufficiently close to each other to generate an electromagnetic coupling).

Phase shifters formed of lumped elements are limited to very narrow frequency bands (narrower than some ten MHz).

The present invention more specifically applies to distributed phase shifters which may process wider frequency bands.

FIG. 3 shows a conventional example of a phase shifter 1' made in integrated form with distributed lines. In FIG. 3, the details of the lines have not been shown and only functional blocks are illustrated. In such an embodiment, the phase shifter uses both a balun transformer 17 and a combiner 18 (COMB). Transformer 17 is in charge of transforming the differential signals present on input terminals IN0 and IN180 into an intermediary common-mode signal INT. Signal INT is divided by combiner 18 to form two signals in phase quadrature provided on outputs OUT0 and OUT90.

A disadvantage of phase shifter 1' of FIG. 3 is its large size. Indeed, in a technique with distributed lines, the line lengths are by a quarter or an eighth of the wavelength of the central frequency of the frequency band to be processed, and a multiplication of the devices increases the size.

Another disadvantage of phase shifter 1' of FIG. 3 is that it exhibits high insertion losses.

SUMMARY OF THE INVENTION

The present invention aims at overcoming all or part of the disadvantages of conventional phase quadrature phase shifters.

The present invention more specifically aims at forming a phase quadrature phase shifter by using a thin layer technology of the type used in integrated circuit manufacturing.

The present invention also features decreasing the bulk of a phase shifter with respect to conventional distributed solutions.

The present invention also features decreasing insertion losses by decreasing the phase shifter size.

To achieve all or part of these objects, as well as others, the present invention provides a distributed phase shifter comprising:

a first planar winding having its ends defining accesses in phase opposition;

a second planar winding coupled with the first one and grounded by a first capacitive element;

a third planar winding in a conductive level different from that receiving the first winding and electrically in series with the second winding; and a fourth planar winding, coupled with the third one in a conductive level different from that receiving the second winding, first ends of the third and fourth windings being connected by a capacitive element and their second ends being connected by another capacitive element, their first and second respective ends defining accesses in phase quadrature.

According to an embodiment of the present invention, the second and third windings are formed side by side in a first conductive level, the first and fourth windings being formed side by side in a second conductive level, the second and third windings being respectively superposed to the first and fourth ones and a third conductive level being used to form contact tracks of the internal ends of the windings.

According to an embodiment of the present invention, all windings wind in the same direction.

According to an embodiment of the present invention, the first and second windings are interleaved with each other in a first conductive level, the third and fourth windings being interleaved with each other in a second conductive level superposed to the first one.

According to an embodiment of the present invention, the windings formed in different levels wind in reverse directions.

According to an embodiment of the present invention, a resistive element grounds the first end of the fourth winding.

According to an embodiment of the present invention, capacitive elements have values selected from a range from 0.5 to 10 picofarads.

According to an embodiment of the present invention, the capacitive elements are lumped elements.

The present invention also provides a radio-frequency transceiver circuit.

The foregoing and other objects, features, and advantages of the present invention will be discussed in detail in the following non-limiting description of specific embodiments in connection with the accompanying drawings.

BRIEF DESCRIPTION OF THE DRAWINGS

FIG. 6 is a simplified exploded perspective view of conductive levels taking part in an integrated embodiment of a phase shifter according to a second embodiment of the present invention; and FIGS. 7A and 7B are cross-section views along lines A-A and B-B of FIG. 6.

DETAILED DESCRIPTION

Figure 1:
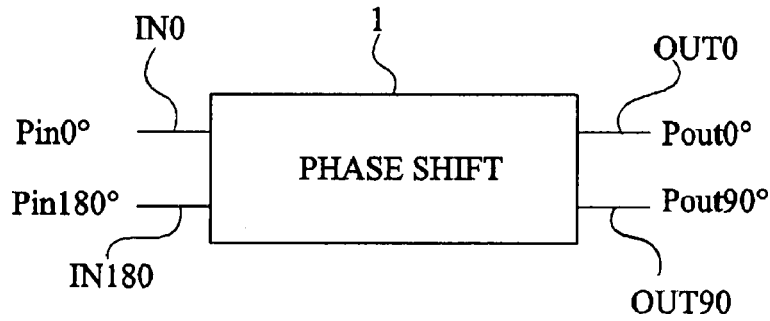
FIG. 1, previously described, is a block diagram of a phase shifter of the type to which the present invention applies.
Figure 2:
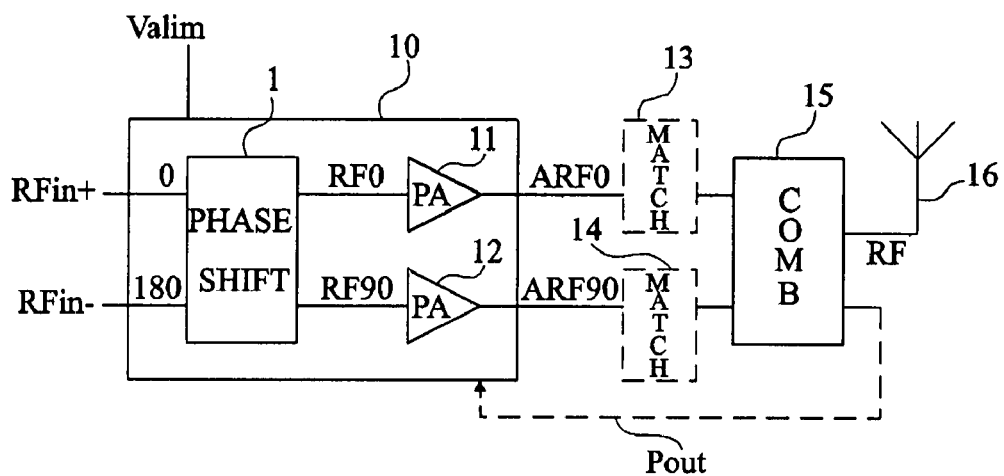
FIG. 2 is a schematic block diagram of an example of an electronic circuit using a phase shifter of the type to which the present invention applies.

The same elements have been designated with the same reference numerals in the different drawings, which have been drawn out of scale. For clarity, only those elements which are useful to the understanding of the present invention have been shown in the drawings and will be described hereafter. In particular, the applications of a phase shifter of the present invention have not all been detailed, such a phase shifter being usable to replace a conventional device in any application applying a 90° phase shift. Similarly, methods for forming thin layers by using integrated circuit manufacturing technologies have not been detailed, the present invention being compatible with conventional techniques.

Figure 4:
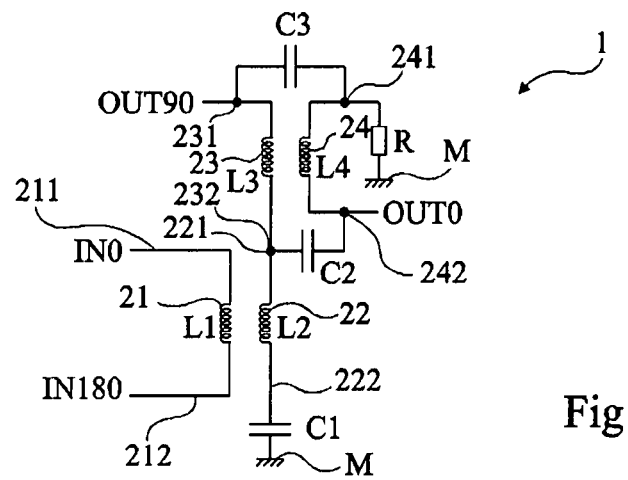
FIG. 4 shows the equivalent electric diagram of a phase shifter according to an embodiment of the present invention.

FIG. 4 shows the electric diagram of a phase shifter 1 according to an embodiment of the present invention. A first line 21 defines a first inductive element L1 having its two ends 211 and 212 defining accesses, arbitrarily called input accesses, IN0 and IN180, of signals in phase opposition. A second line 22, coupled to the first one, defines a second inductive element L2. A third line 23 defines a third inductive element L3 having a first end 231 defining an access OUT90, arbitrarily called output access, of a signal phase-shifted by 90° with respect to the signal of terminal IN0. A second end 232 of element L3 is confounded with first end 221 of second inductive element L2 with which it is thus electrically in series. Second end 222 of second line 22 is connected to ground M via a first capacitive element C1. A fourth line 24, coupled with the third one, defines a fourth inductive element L4 having a first end 241 connected to ground M by a resistive element R and having a second end 242 defining an output access OUT0 of a signal in phase quadrature with the signal present on access OUT90. Further, end 242 is connected to junction point 232-221 between windings L2 and L3 by a second capacitive element C2, and first respective ends 231 and 241 of the third and fourth lines are connected to each other by a third capacitive element C3.

The value of resistive element R depends on the reference impedance of the assembly. It is generally set to 50 ohms.

Capacitive elements C1 enables adjusting the operating frequency band. Capacitive elements C2 and C3 ensure the quadrature phase shift of outputs OUT0 and OUT90 with respect to each other.

Inductances L1 to L4 are sized to be of the order of magnitude of the desired mutual inductances. Such mutual inductances (for example, on the order of from 4 to 30 nH) are high to obtain a sufficiently strong inductive coupling to operate in radiofrequency band. The orders of magnitude are of course adapted according to the coupling coefficients, which depend on the design and on technology. Capacitive element C1 enables lowering the central passband frequency to decrease the value and the size of inductances L1 to L4.

Figure 5A:
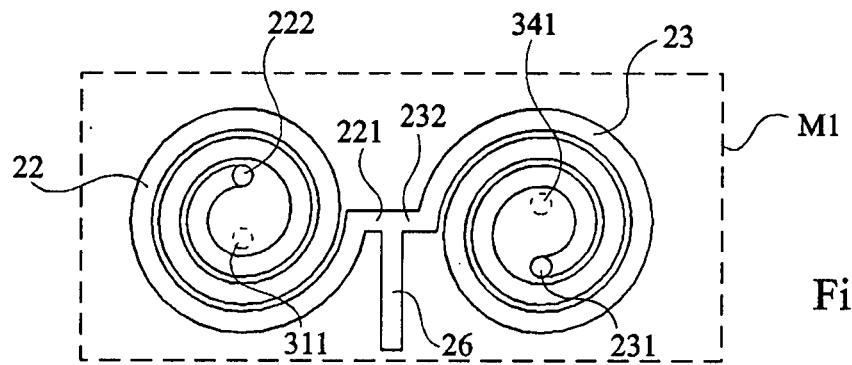
FIGS. 5A, 5B, and 5C are top views of conductive levels taking part in an integrated embodiment of the coupled lines of the phase shifter of FIG. 4 according to a first embodiment of the present invention.
Figure 5B:
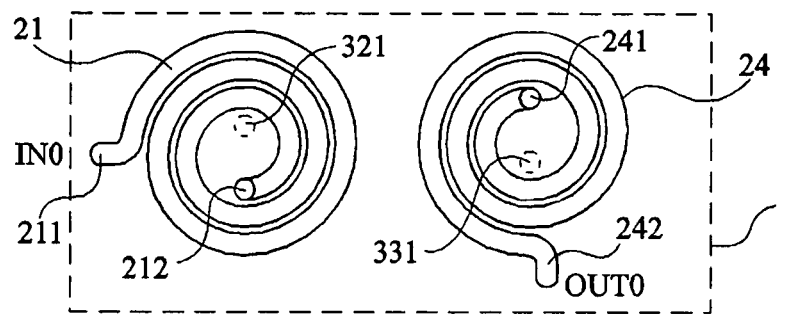
Figure 5C:
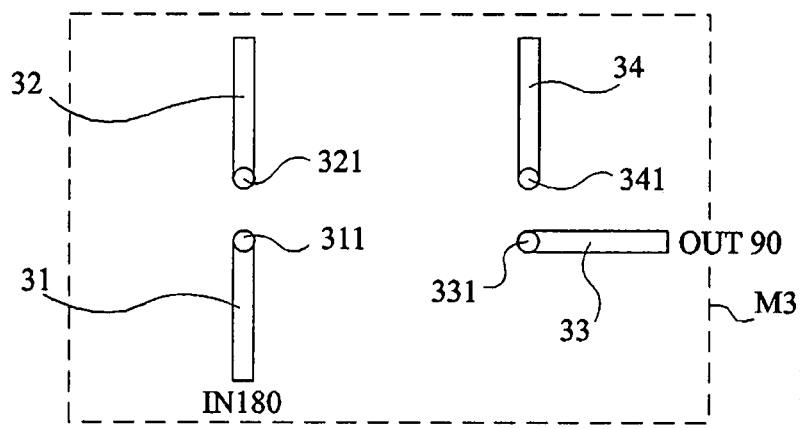

FIGS. 5A, 5B, and 5C illustrate a first embodiment of inductive elements L1 to L4 in the form of planar conductive windings to form a phase shifter such as shown in FIG. 4. Such drawings are simplified top views of three conductive levels used for this embodiment and are to be seen as stacked up on one another.

As illustrated in FIG. 5A, the two windings 22 and 23 in series with each other are formed in a second conductive level M1 in the form of planar windings side by side and having their external ends 221 and 232 connected to each other. A track 26 intended to be connected to a first electrode of capacitive element C2 (not shown) is connected to common ends 221 and 232.

Windings 21 and 24 are formed in another conductive level M2 by being respectively located above windings 22 and 23 to obtain a coupling effect. External end 211 of winding 21 defines terminal IN0 while external end 242 of winding 24 defines terminal OUT0.

A third conductive level M3 is used to form contact areas of the respective internal ends of the different windings.

Internal ends 212, 222, 231, and 241 of the different windings are each connected by a conductive via to sections 31, 32, 33, and 34, for example, rectilinear, formed in level M3. End 212 is connected to a first end of section 31 by a via 311 and the other end of section 31 defines terminal IN180. End 222 is connected to a first end of a section 32 by a via 321 and the other end of section 32 is intended to be connected to a first electrode of capacitive element C1. Internal end 231 is connected by a via 331 to a first end of track 33 having its other end intended to be connected to a first electrode of capacitive element C3 and to define output terminal OUT90. The second electrode of capacitive element C3 is connected to an end of track 34 having its other end connected by a via 341 to internal end 241 of the fourth winding. Section 34 also connects this end to resistive element R.

It should be noted that the references to levels M1, M2, and M3 do not necessarily represent the stacking order of these levels in the integrated structure. This order is, for example, adapted to the other components (capacitive and resistive elements) to be formed in the structure.

In the structure shown in FIG. 5, all windings 21 to 24 wind clockwise, as seen from above and from the outside. The contrary is of course possible, provided, in this embodiment, for all the windings to wind in the same direction to obtain the wanted phase shift.

FIG. 6 is a very simplified exploded perspective view of a second embodiment of the phase shifter of FIG. 4. This drawing shows windings 21 to 24 and the tracks of transfer of the inner ends of the windings. FIGS. 7A and 7B are simplified cross-section views taken along lines A-A and B-B of FIG. 6.

According to this preferred embodiment, windings 21 and 22 are formed in a same conductive level, for example, M1 (FIGS. 7A and 7B) while being interdigited with each other. Windings 23 and 24 are also interdigited with each other, while being formed in a second level M2. A third level M3 is used to form tracks 31 to 34. A via 35 connects internal ends 221 and 232, and a track 36 brings out the contact for connection to an electrode of element C2. Of course, the different conductive levels are separated by insulating layers 41 to 43, lower layer 41 of the stacking for example being an insulating substrate. Other insulating levels, conductive or semiconductor, may be present in the stacking for other functions.

The fact for windings 21 and 22, respectively 23 and 24, to wind in the same direction enables interleaving or interdigiting them. However, as compared with the embodiment of FIGS. 5A and 5B, windings 24 and 23 wind counterclockwise, as seen from above and from the outside. The contrary is of course possible, provided for the windings forming lines 22 and 23 to wind in reverse directions (from the outside) so that the current flowing through their series association winds in the same direction along the entire path.

A first coupling is obtained by the fact that each winding is interleaved with that with which it must be coupled in the electric diagram of FIG. 4. A second coupling results from the stacking of the different windings. This increase in the coupling coefficient enables, among others, for the developed lengths of the lines forming the windings to be lower than one quarter of the wavelength of the work frequency of the coupler.

Capacitive elements C1 to C3 are, preferably, made in the form of lumped and non-distributed elements.

The passband of the phase shifter depends on the number of turns of the windings (and thus on the value of the inductances) as well as on the value of the associated capacitive elements.

For a given work frequency (central frequency of the phase shifter passband), the shorter the windings, the higher the values of the associated capacitive elements. In applications at high frequency (greater than 100 MHz) more specifically aimed at by the present invention, the capacitive elements will have values ranging between 0.5 pF and 10 pF.

As a specific example of embodiment, to form a phase shifter at a 950-MHz work frequency in the embodiment of FIGS. 5A to 5C, windings 21 to 23 form 4.75 turns and winding 24 forms 4.5 turns. The fact of having a difference of one quarter of a turn between winding 24 and the others enables making ends 241 and 231 to be connected by capacitive element C3 closer to each other.

According to another specific example of embodiment, a phase shifter formed by applying the stacked structure of FIGS. 6, 7A, and 7B is formed with windings of 6.5 turns for a same frequency band. However, the stacked structure enables gaining space with respect to the side-by-side winding structure of FIG. 5.

For a 900-MHz phase shifter, capacitive elements C1 to C3 have values ranging between approximately 1.3 and 3 pF. The implementation of the two embodiments then leads to the following dimensions:

First embodiment (Side-by-side Windings)
developed lengths of the windings: approximately 7,000 µm;
values of inductances L1 to L4: 10 nH;
line widths: approximately 30 µm; and interval between lines: approximately 10 µm.

Second embodiment (Interleaved and Superposed Windings)
developed lengths of the windings: approximately 6,000 µm;
values of inductances L1 to L4: 10 µH;
line widths: approximately 30 µm; and interval between lines: approximately 10 µm.

An advantage of the present invention is that the lengths of the coupled lines no longer need be equal to one quarter of the wavelength of the work frequency.

Another advantage of the present invention in its preferred embodiment is that by stacking up the windings, the phase shifter bulk is further decreased.

Figure 3:
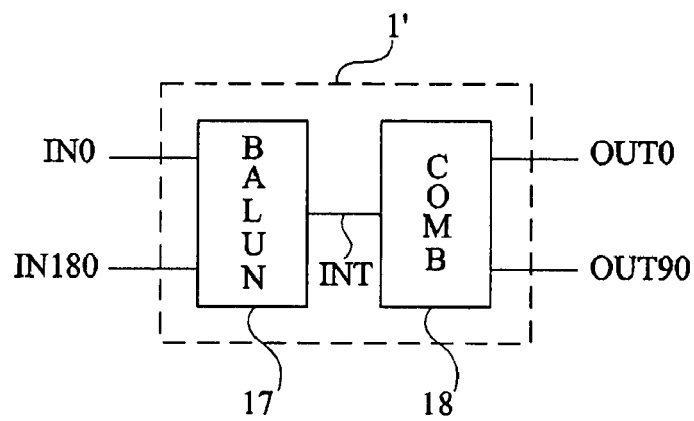
FIG. 3 shows a conventional example of an integrated phase shifter.

Another advantage of the present invention is that the surface area taken up by the phase shifter is lesser than in a conventional structure with distributed lines of the type illustrated in FIG. 3.

Another advantage of the present invention is that the size decrease goes along with a decrease in insertion losses.

Of course, the present invention is likely to have various alterations, modifications, and improvements which will readily occur to those skilled in the art. In particular, the dimensions to be given to the coupled lines (to the lengths as to the sections) depend on the application and are within the abilities of those skilled in the art according, in particular, to the desired line resistance and to the work frequencies of the phase shifter.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A distributed phase shifter comprising:
a first planar winding having its ends defining accesses in phase opposition;
a second planar winding coupled with the first one and grounded by a first capacitive element;
a third planar winding in a conductive level different from that receiving the first winding and electrically in series with the second winding; and
a fourth planar winding, coupled with the third one in a conductive level different from that receiving the second winding, first ends of the third and fourth windings being connected by a capacitive element and their second ends being connected by another capacitive element, their first and second respective ends defining accesses in phase quadrature.

2. The phase shifter of claim 1, wherein the second and third windings are formed side by side in a first conductive level, the first and fourth windings being formed side by side in a second conductive level, the second and third windings being respectively superposed to the first and fourth ones and a third conductive level being used to form contact tracks of the internal ends of the windings.

3. The phase shifter of claim 2, wherein all windings wind in the same direction.

4. The phase shifter of claim 1, wherein the first and second windings are interleaved with each other in a first conductive level, the third and fourth windings being interleaved with each other in a second conductive level superposed to the first one.

5. The phase shifter of claim 4, wherein the windings formed in different levels wind in reverse directions.

6. The phase shifter of claim 1, wherein a resistive element grounds the first end of the fourth winding.

7. The phase shifter of claim 1, wherein capacitive elements have values selected from a range from 0.5 to 10 picofarads.

8. The phase shifter of claim 1, wherein the capacitive elements are lumped elements.

9. A radio-frequency transceiver circuit comprising at least one phase shifter according to claim 1.

* * * * *